United States Patent
Hsu et al.

(10) Patent No.: US 11,620,940 B1
(45) Date of Patent: Apr. 4, 2023

(54) DRIVING CIRCUIT HAVING A LEVEL SHIFTER RECEIVING AN INPUT SIGNAL FROM PREVIOUS-STAGE

(71) Applicant: AU Optronics Corporation, Hsin-Chu (TW)

(72) Inventors: Chung-Hsien Hsu, Hsin-Chu (TW); Ming-Hung Tu, Hsin-Chu (TW); Ya-Fang Chen, Hsin-Chu (TW); Chih-Hsiang Yang, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 17/675,199

(22) Filed: Feb. 18, 2022

(30) Foreign Application Priority Data

Dec. 3, 2021 (TW) ................................. 110145362

(51) Int. Cl.
*G09G 3/32* (2016.01)
*G11C 19/00* (2006.01)
*H03K 19/0185* (2006.01)
*H01L 29/10* (2006.01)

(52) U.S. Cl.
CPC ....... *G09G 3/32* (2013.01); *G09G 2300/0452* (2013.01); *G09G 2300/0809* (2013.01); *G09G 2310/0286* (2013.01); *G09G 2310/0289* (2013.01); *G09G 2320/043* (2013.01); *G11C 19/00* (2013.01); *H01L 29/1083* (2013.01); *H03K 19/018507* (2013.01)

(58) Field of Classification Search
CPC ...................................................... G09G 3/32
USPC ...................................................... 345/214
See application file for complete search history.

(56) References Cited

U.S. PATENT DOCUMENTS

| 6,326,959 | B1 | 12/2001 | Tanaka |
| 8,344,410 | B2 * | 1/2013 | Wendler ................ G06F 3/1446 |
| | | | 257/99 |
| 11,355,043 | B1 * | 6/2022 | Choi ...................... G06F 3/017 |
| 2006/0291115 | A1 | 12/2006 | Song et al. |
| 2008/0054979 | A1 | 3/2008 | Nagumo |

FOREIGN PATENT DOCUMENTS

| CN | 105556667 A | 5/2016 |
| CN | 111756366 A | 10/2020 |

OTHER PUBLICATIONS

Lu et al. "U.S. Appl. No. 17/516,730", filed Nov. 2, 2021, USA.

* cited by examiner

*Primary Examiner* — Long D Pham
(74) *Attorney, Agent, or Firm* — WPAT, PC

(57) ABSTRACT

The present disclosure provides a driving circuit, including a transistor and a level shifter. The first terminal of the transistor is electrically connected to a light emitting diode and is configured to receive a supply voltage. The second terminal of the transistor is configured to receive a first reference voltage. The level shifter is configured to receive an input signal from a previous-stage driving circuit and adjust the voltage level of the input signal according to a voltage operating range formed by the supply voltage and the first reference voltage to generate a level-shifted signal corresponding to the voltage operating range and configured to control the transistor. The input signal varies between a second reference voltage and the supply voltage. The second reference voltage and the first reference voltage are different from each other and both lower than the supply voltage.

20 Claims, 9 Drawing Sheets

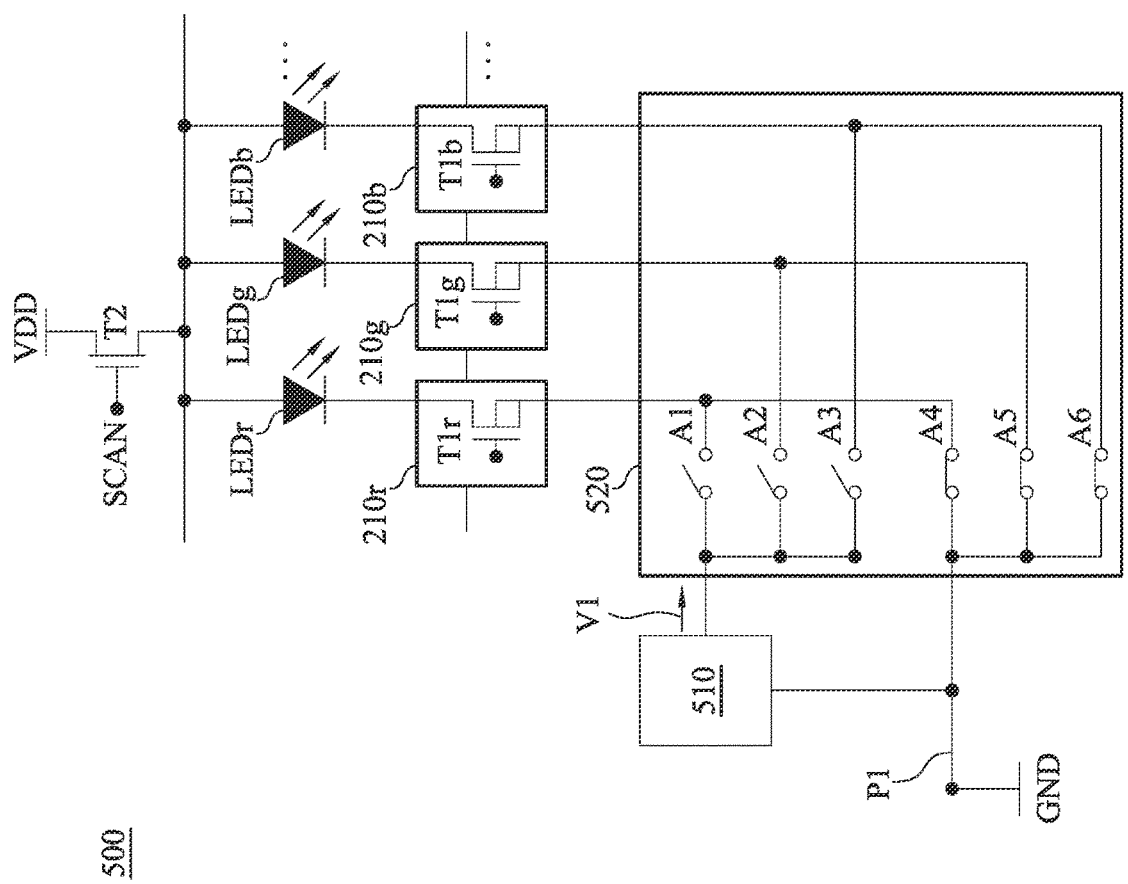

US 11,620,940 B1

DRIVING CIRCUIT HAVING A LEVEL SHIFTER RECEIVING AN INPUT SIGNAL FROM PREVIOUS-STAGE

CROSS-REFERENCE TO RELATED APPLICATION

This application claims priority to Taiwan Application Serial Number 110145362, filed Dec. 3, 2021, which is herein incorporated by reference in its entirety.

BACKGROUND

Field of Invention

The present disclosure relates to a driving circuit. More particularly, the present disclosure relates to a driving circuit including a level shifter.

Description of Related Art

When a traditional common anode framework is used to control the red, green, and blue light emitting diodes (LEDs) in a display, because the forward voltage of the red light emitting diode is smaller than the forward voltages of the green and blue light emitting diodes, the current flowing from the cathode of the red light emitting diode to the ground is higher than the others, and when heat keeps accumulating, there can be risk of burning out.

SUMMARY

The present disclosure provides a driving circuit, comprising a transistor and a level shifter. The first terminal of the transistor is electrically connected to a light emitting diode and configured to receive a supply voltage, and the second terminal of the transistor is configured to receive a first reference voltage. The level shifter is configured to receive an input signal from a previous-stage driving circuit and adjust the voltage level of the input signal according to a voltage operating range formed by the supply voltage and the first reference voltage in order to generate a level-shifted signal consistent with the voltage operating range and configured to control the transistor. The input signal varies between a second reference voltage and the supply voltage, and the second reference voltage and the first reference voltage are different from each other and both lower than the supply voltage.

The present disclosure also provides a driving circuit, comprising a first transistor, a second transistor, a third transistor, a fourth transistor, a first level shifter, a second level shifter, and a third level shifter. The first terminal of the first transistor is configured to receive a supply voltage, and the second terminal of the first transistor is electrically connected to a first light emitting diode, a second light emitting diode, and a third light emitting diode. The first terminal of the second transistor is electrically connected to the first light emitting diode, and the second terminal of the second transistor is configured to receive a first reference voltage. The first terminal of the third transistor is electrically connected to the second light emitting diode, and the second terminal of the third transistor is configured to receive a second reference voltage. The first terminal of the fourth transistor is electrically connected to the third light emitting diode, and the second terminal of the fourth transistor is configured to receive the first reference voltage. The first level shifter is configured to receive a first signal and generate a second signal according to the first signal. The second level shifter is configured to receive the second signal and generate a third signal according to the second signal. The third level shifter is configured to receive the third signal and generate a fourth signal according to the third signal. The first level shifter is configured to transmit the second signal to the second level shifter and the gate of the second transistor, the second level shifter is configured to transmit the third signal to the third level shifter and the gate of the third transistor, and the third level shifter is configured to transmit the fourth signal to the gate of the fourth transistor.

The present disclosure also provides a driving circuit, comprising a first transistor, a second transistor, a third transistor, a fourth transistor, a level shifter, and a voltage-selection switch. The first terminal of the first transistor is configured to receive a supply voltage, and the second terminal of the first transistor is electrically connected to a first light emitting diode, a second light emitting diode, and a third light emitting diode. The first terminal of the second transistor is electrically connected to the first light emitting diode. The first terminal of the third transistor is electrically connected to the second light emitting diode. The first terminal of the fourth transistor is electrically connected to the third light emitting diode. The level shifter is configured to receive a ground voltage and raise the ground voltage to a third reference voltage. The voltage-selection switch is electrically connected to the second transistor, the third transistor, and the fourth transistor and configured to control the second terminals of the second transistor, the third transistor, and the fourth transistor to receive the ground voltage or the third reference voltage.

BRIEF DESCRIPTION OF THE DRAWINGS

The invention can be more fully understood by reading the following detailed description of the embodiment, with reference made to the accompanying drawings as follows:

FIG. 5B is a diagram of a display panel in accordance with some embodiments of the present disclosure.

DETAILED DESCRIPTION

Figure 1B:
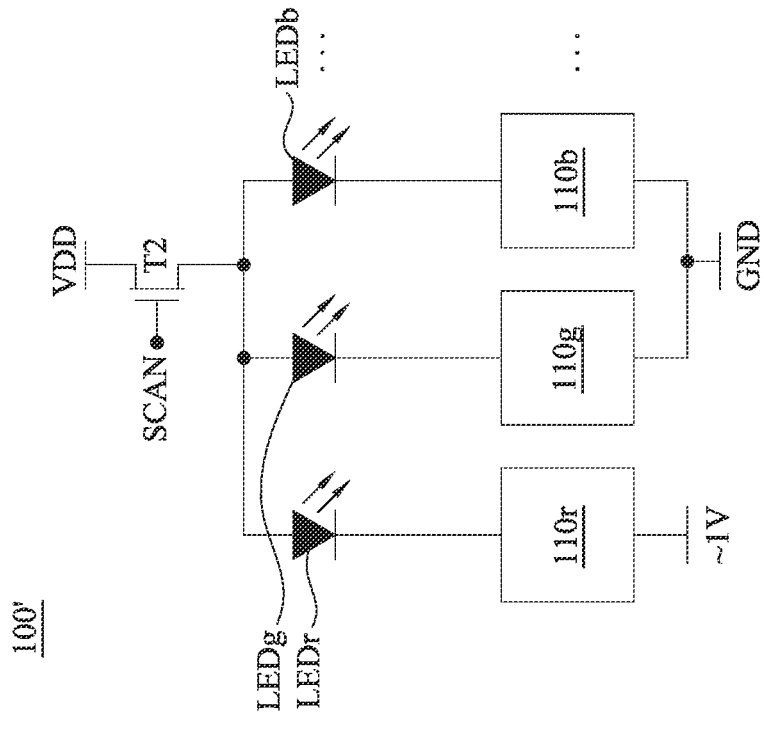
FIG. 1B is a diagram of a display panel having a semi common anode framework.

Reference will now be made in detail to embodiments of the present disclosure, examples of which are described herein and illustrated in the accompanying drawings. While the disclosure will be described in conjunction with embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. It is noted that, in accordance with the standard practice in the industry, the drawings are only used for understanding and are not drawn to scale. Hence, the drawings are not meant to limit the actual embodiments of the present disclosure. In fact, the dimensions of the various features may be arbitrarily increased or reduced for clarity of discussion. Wherever possible, the same reference numbers are used in the drawings and the description to refer to the same or like parts for better understanding.

The terms used in this specification generally have their ordinary meanings in the art, within the context of the invention, and in the specific context where each term is used.

As used in the present disclosure, the terms "comprising," "including," "having," "containing," "involving," and the like are to be understood to be open-ended, i.e., to mean including but not limiting to. In addition, as used in the present disclosure, the term "and/or" includes any and all combinations of one or more of the associated listed items. Moreover, it will be understood that, although the terms "first," "second," etc., may be used herein to describe various elements, these elements should not be limited by these terms. These terms are used to distinguish one element from another.

Figure 1A:
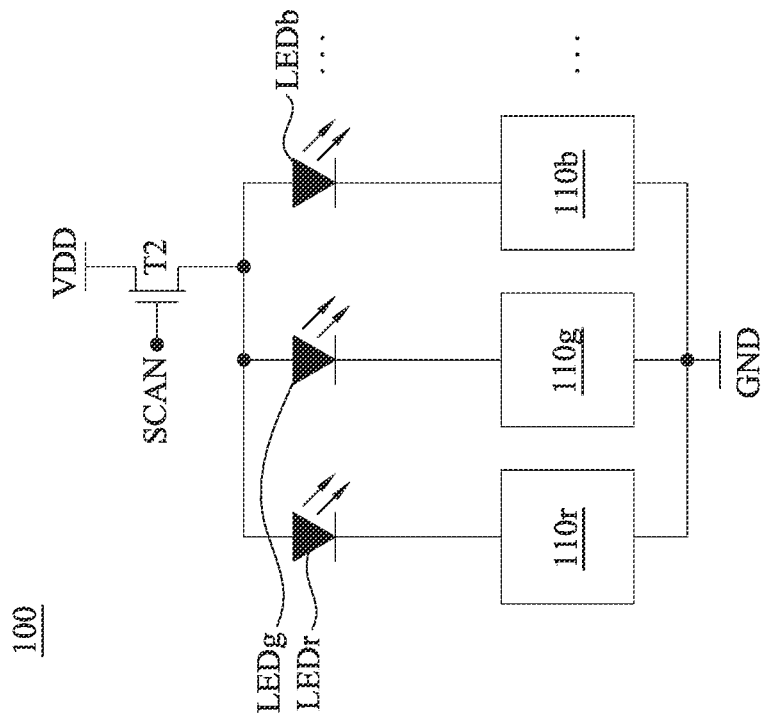
FIG. 1A is diagram of a display panel.

When a common anode framework is adopted to drive the light emitting diodes (LEDs) of a display, problems such as the voltage difference between the cathode of red light emitting diode and the ground voltage being too large, or the temperature of electric line being too high will occur. Please refer to FIG. 1A. FIG. 1A is a diagram of a display panel 100. The display panel 100 includes multiple light emitting diodes (such as the red light emitting diode LEDr, the green light emitting diode LEDg, and the blue light emitting diode LEDb in FIG. 1A) and multiple driving circuits 110r, 110g, and 110b which are configured to drive the light emitting diodes. The display panel 100 adopts the common anode framework. As shown in FIG. 1A, the anodes of the red light emitting diode LEDr, the green light emitting diode LEDg, and the blue light emitting diode LEDb are electrically connected to each other and configured to receive a supply voltage VDD. Such framework is the so-called common anode framework. In one embodiment, the supply voltage VDD is 3.8 volt (V). The cathodes of the red light emitting diode LEDr, the green light emitting diode LEDg, and the blue light emitting diode LEDb are electrically connect to the driving circuits 110r, 110g, and 110b respectively. The driving circuits 110r, 110g, and 110b are configured to control the currents passing through the light emitting diodes. The driving circuits 110r, 110g, and 110b are electrically connect to each other to receive a ground voltage GND.

In the common anode framework as shown in FIG. 1A, because the forward voltage of the red light emitting diode LEDr is generally smaller than the forward voltages of the green light emitting diode LEDg and the blue light emitting diode LEDb (for example, in one embodiment, the forward voltage of the red light emitting diode LEDr is about 2.2 V, and the forward voltages of the green light emitting diode LEDg and the blue light emitting diode LEDb are about 2.8 V), the voltage at the cathode of the red light emitting diode LEDr is greater than the voltages at the cathodes of the green light emitting diode LEDg and the blue light emitting diode LEDb. The current flowing from the cathode of the red light emitting diode LEDr to the ground (i.e., the current flowing from one end of the driving circuit 110r to the other end of the driving circuit 110r) is larger, and, because of the existence of wire resistance, such large current will be transferred into heat. If heat keeps accumulating, there will be risk of burning out.

The problem mentioned above can be avoided by adopting a semi common anode framework. Please refer to FIG. 1B. FIG. 1B is a diagram of a display panel 100' having a semi common anode framework. In some examples, as shown in FIG. 1B, unlike the common anode framework shown in FIG. 1A, the driving circuit 110r connected to the cathode of the red light emitting diode LEDr receives a voltage about 1 V, and the driving circuits 110g and 110b respectively connected to the cathodes of the green light emitting diode LEDg and the blue light emitting diode LEDb receive the ground voltage GND. In this way, the driving currents passing through the driving circuits 110r, 110g, and 110b can be more balanced, the current will not concentrate at the driving circuit 110r, and the problem that the common anode framework has can be solved.

Figure 2A:
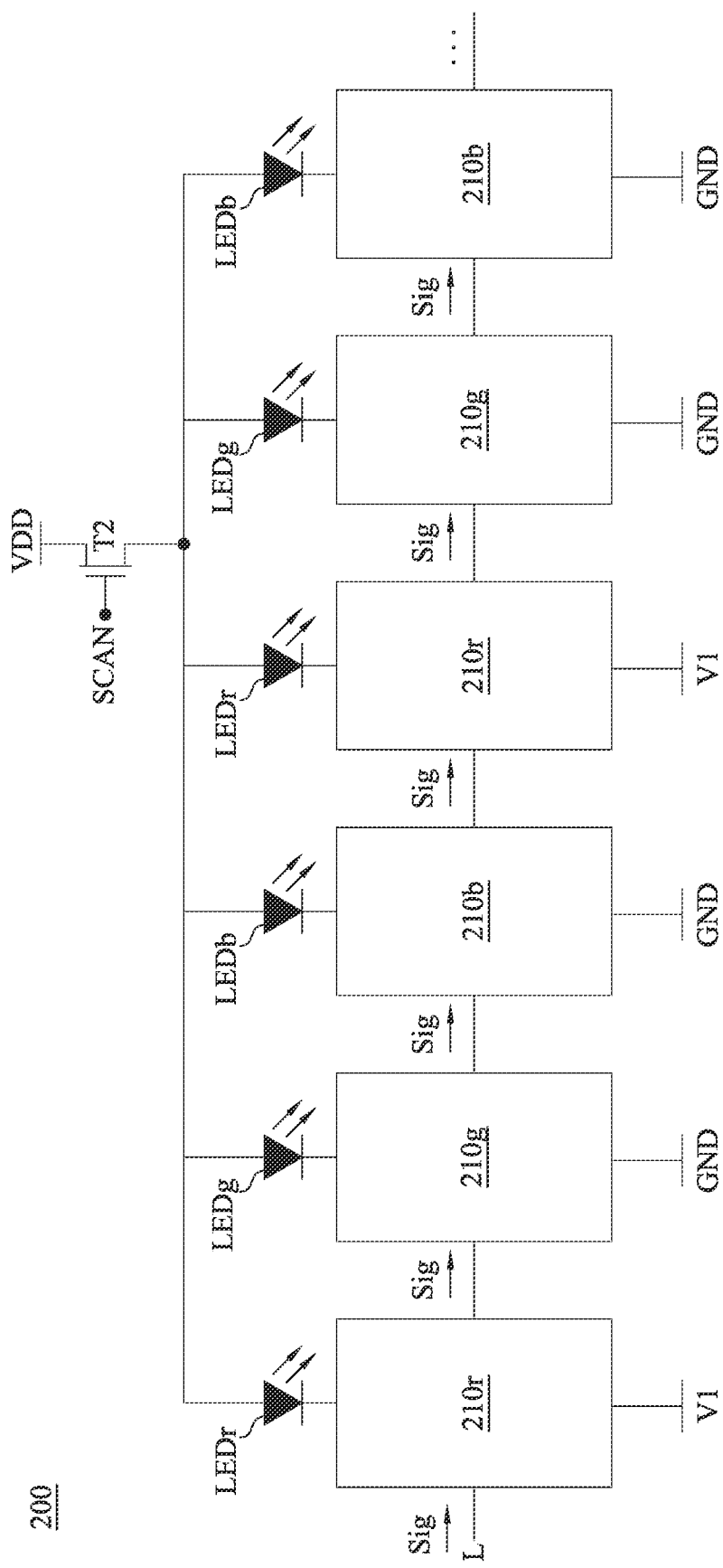
FIG. 2A is a diagram of a display panel in accordance with some embodiments of the present disclosure.

Please then refer to FIG. 2A. FIG. 2A is a diagram of a display panel 200 in accordance with some embodiments of the present disclosure. The display panel 200 includes multiple sets of serially-arranged red light emitting diode LEDr, green light emitting diode LEDg, and blue light emitting diode LEDb. The light emitting diodes are configured to transmit light with different colors and to form pixels. For example, three light emitting diodes (including one red light emitting diode LEDr, one green light emitting diode LEDg, and one blue light emitting diode LEDb) can form a pixel. The first terminal of the transistor T2 is configured to receive the supply voltage VDD, the second terminal of the transistor T2 is electrically connected to the anodes of the red light emitting diodes LEDr, the green light emitting diodes LEDg, and the blue light emitting diodes LEDb, and the gate terminal of the transistor T2 is configured to receive a scan signal SCAN. The scan signal SCAN is configured to determine whether to conduct the transistor T2.

The display panel 200 includes multiple driving circuits 210r, 210g, and 210b. Each of the driving circuits 210r, 210g, and 210b is electrically connected to the corresponding red light emitting diode LEDr, green light emitting diode LEDg, or blue light emitting diode LEDb and is configured to control the current size and brightness of the light emitting diode. In FIG. 2A, the driving circuit 210g is coupled between the cathode of the green light emitting diode LEDg and the ground voltage GND, and the driving circuit 210b is coupled between the cathode of the blue light emitting diode LEDb and the ground voltage GND. As stated above, the driving circuit 210r is coupled between the cathode of the red light emitting diode LEDr and the first reference voltage V1 in order to resolve the difference in forward voltage between the red light emitting diode LEDr and other light emitting diodes. In one embodiment, the first reference voltage V1 is set as about 1 V, which is slightly above the ground voltage GND (the ground voltage GND is about 0 V).

As shown in FIG. 2A, the driving circuits 210r, 210g, and 210b receive digital control signals (such as the input signal Sig shown in FIG. 2A) through line L. For example, digital control signals can include clock signal, serial input signal, serial output signal and/or enabling signal, and these signals can be configured to control clock, light emitting brightness, enablement, or turn-off of the driving circuits 210r, 210g, and 210b. It should be noted that the digital control signals (such as the input signal Sig in FIG. 2A) are generally switched between two logic levels—a high logic level generally determined by the supply voltage VDD and a low logic level generally determined by the ground voltage GND. As shown in FIG. 2A, the driving circuit 210r receives a voltage about 1 V, and the driving circuits 210g and 210b receive the ground voltage GND. Because the voltage of 1 V received by the driving circuit 210r is higher than the voltage received by the driving circuits 210g and 210b, when the input signal Sig is transmitted among the driving circuits 210r, 210g, and 210b, the driving circuits 210r, 210g, and 210b can determine differently as to the logic level of the input signal Sig, and thus the input signal Sig can be misjudged.

Figure 2B:
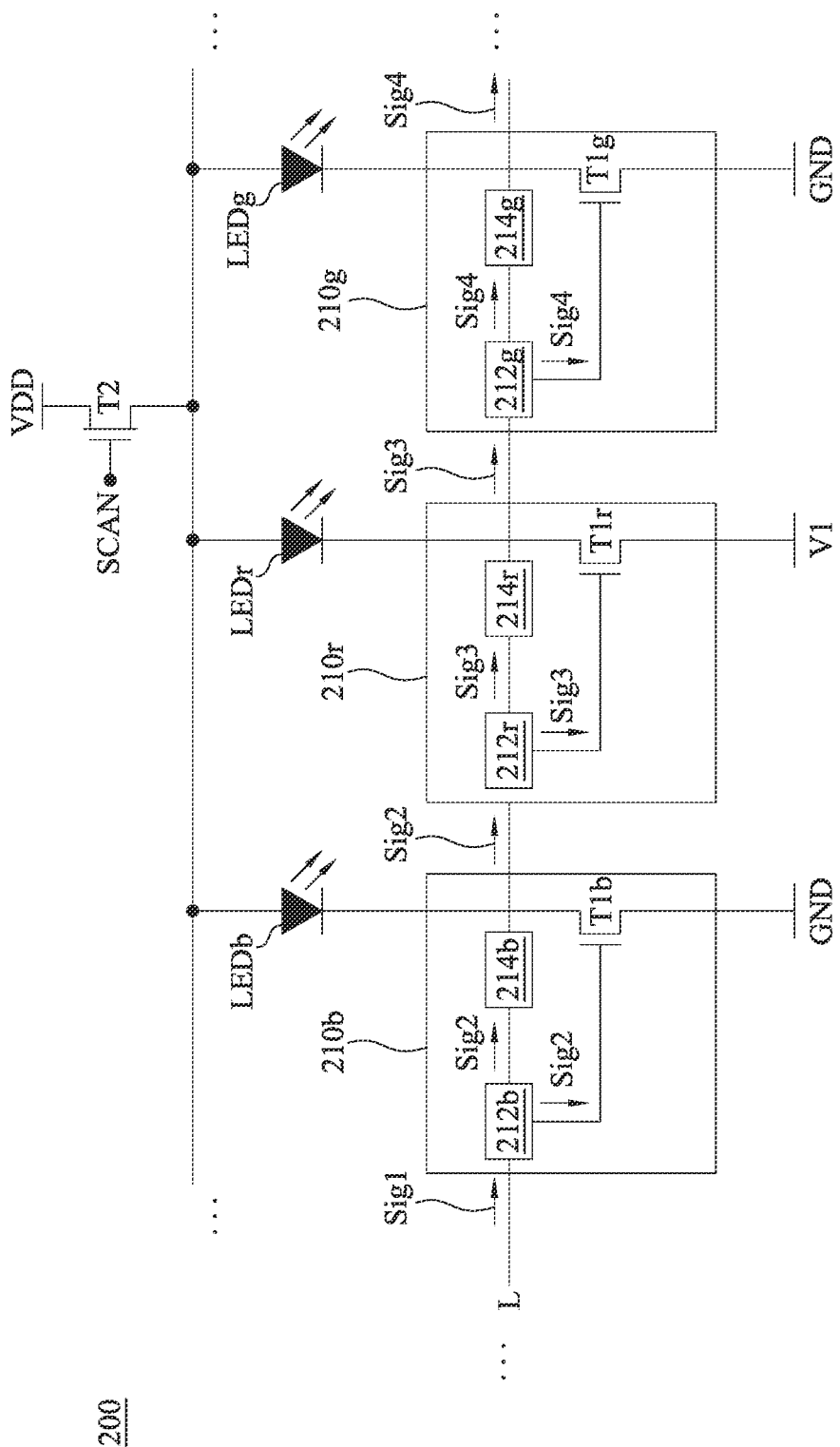
FIG. 2B is a diagram of a display panel in accordance with some embodiments of the present disclosure.

In order to solve the problem stated above, in the embodiment shown in FIG. 2B, each driving circuit includes a level shifter configured to adjust the voltage level of the input signal. Please refer to FIG. 2B. FIG. 2B is a diagram of the display panel 200 in accordance with some embodiments of the present disclosure. The display panel 200 in FIG. 2B corresponds to a portion of the embodiment shown in FIG. 2A. In other words, the driving circuits 210b, 210r, and 210g in FIG. 2B correspond to the driving circuits 210b, 210r, and 210g in the middle of FIG. 2A. Details regarding the components, connection relationship, and signal transmissions of the driving circuits 210b, 210r, and 210g are described below.

The driving circuit 210b includes a transistor T1b, a level shifter 212b, and a shift register 214b. The first terminal of the transistor T1b is electrically connected to the blue light emitting diode LEDb, and the second terminal of the transistor T1b is configured to receive the ground voltage GND. The level shifter 212b is configured to receive a signal Sig1 from a previous-stage driving circuit (i.e., the driving circuit 210g on the left side of the driving circuit 210b in FIG. 2A) and to adjust the voltage level of the signal Sig1 according to the voltage operating range formed by the supply voltage VDD and the ground voltage GND, in order to generate a level-shifted signal Sig2 that is consistent with the voltage operating range. In one embodiment, the signal Sig2 is configured to control the transistor T1b. For example, the gate of the transistor T1b receives the signal Sig2, and the signal Sig2 is configured to determine the extent that the transistor T1b conducts and thus to control the current passing through the blue light emitting diode LEDb. It should be noted that all external signals that the driving circuit 210b receives (such as the signal Sig1) will be level shifted by the level shifter 212b, and the level-shifted signal Sig2 can be provided to and used by components of the driving circuit 210b.

Please refer to FIG. 2A and FIG. 2B. The signal Sig1 that the driving circuit 210b receives is from the previous-stage driving circuit 210g, of which the voltage operating range is formed by the supply voltage VDD and the ground voltage GND. In other words, the driving circuits 210g and 210b have the same voltage operating range, and thus the driving circuit 210b can use the signal Sig1 directly and no misjudgment as to the logic level of the signal will occur. In other words, the level shifter 212b of the driving circuit 210b does not have to perform level shifting to the signal Sig1. Instead, the level shifter 212b can directly use the signal Sig1 as the signal Sig2.

Figure 3A:
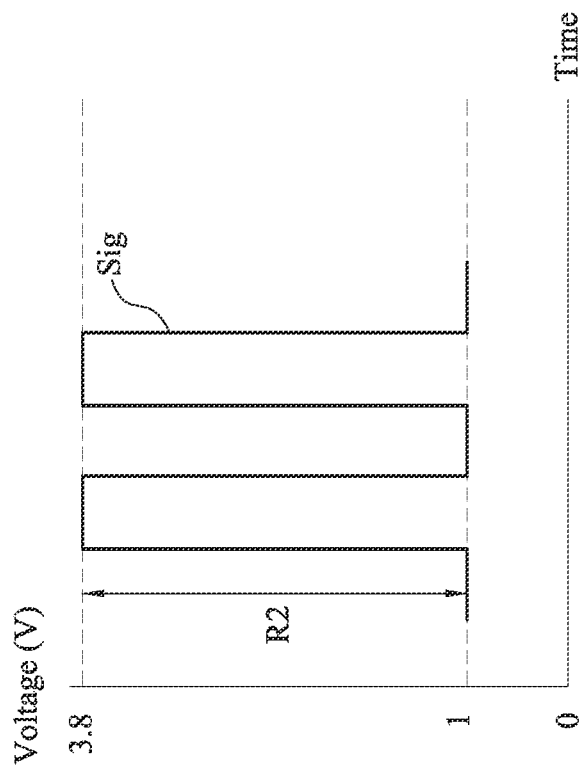
FIG. 3A is a waveform diagram of a signal having a voltage operating range in accordance with some embodiments of the present disclosure.

Please refer to FIG. 3A as well. FIG. 3A is a waveform diagram of the signal Sig having a voltage operating range R1 in accordance with some embodiments of the present disclosure. In one embodiment, the supply voltage VDD is 3.8 V, and, as stated above, the voltage operating ranges of the driving circuit 210b and the previous-stage driving circuit 210g are both about equal to the range formed by the supply voltage VDD and the ground voltage GND. Therefore, in one embodiment, both the signal Sig1 generated by the driving circuit 210g and the signal Sig2 generated by the driving circuit 210b have waveforms that are the same as the waveform of the signal Sig in FIG. 3A. The signal Sig in FIG. 3A has the voltage operating range R1 that is consistent with the range of 0 V~3.8 V.

Please refer to FIG. 2B again. The driving circuit 210b includes the shift register 214b that is electrically connected to the level shifter 212b. The shift register 214b is configured to temporarily store the signal Sig2 and transmit the signal Sig2 to the driving circuit 210r. In one embodiment, the shift register 214b is a first-in-first-out (FIFO) shift register.

Below discuss the driving circuit 210r in FIG. 2B. The level shifter 212r of the driving circuit 210r receives the signal Sig2 and performs level shifting to it, and then generates the signal Sig3 and transmits it to the shift register 214r and the gate of the transistor T1r. The shift register 214r temporarily stores the signal Sig3 and then transmits it to the driving circuit 210g. Because the driving circuit 210r receives the supply voltage VDD and a voltage about 1 V, its voltage operating range is about 1 V~3.8 V.

Figure 3B:
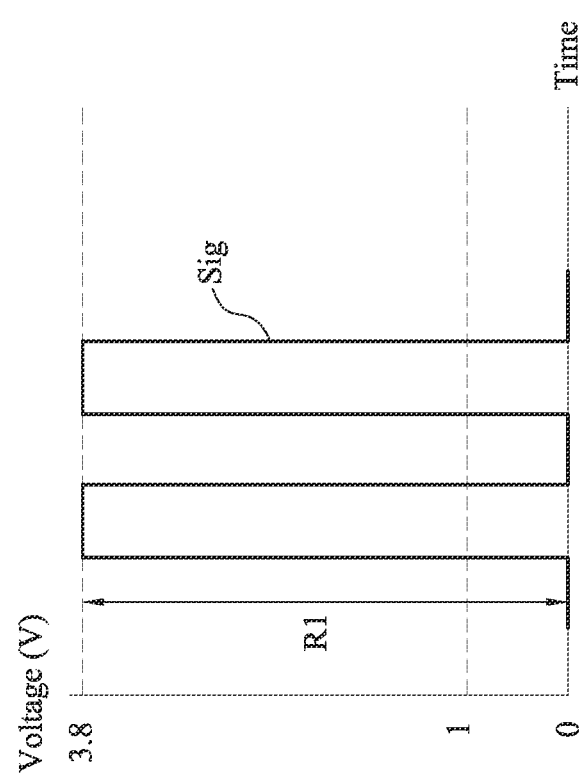
FIG. 3B is a waveform diagram of a signal having a voltage operating range in accordance with some embodiments of the present disclosure.

Please refer to FIG. 3B as well. FIG. 3B is a waveform diagram of the signal Sig having a voltage operating range R2 in accordance with some embodiments of the present disclosure. In one embodiment where the supply voltage VDD is 3.8 V, when the level shifter 212r of the driving circuit 210r receives the signal Sig2, the level shifter 212r will convert the signal Sig2 that has the voltage operating range R1 as shown in FIG. 3A into the signal Sig3 that has the voltage operating range R2 as shown in FIG. 3B, so that the signal Sig3 will vary in the voltage operating range R2 of 1 V~3.8 V and thus can be utilized by the driving circuit 210r.

Below discuss the driving circuit 210g that is on the right side of the driving circuit 210r in FIG. 2B. The level shifter 212r of the driving circuit 210r receives the signal Sig2 and performs level shifting to it, and then generates the signal Sig3 and transmits it to the shift register 214r and the gate of the transistor T1r. The shift register 214r then temporarily stores the signal Sig3 and transmits it to the driving circuit 210g. Because the driving circuit 210g receives the supply voltage VDD and the ground voltage GND, its voltage operating range is about 0 V~3.8 V.

Please refer to FIG. 3A and FIG. 3B. In one embodiment where the supply voltage VDD is 3.8 V, when the level shifter 212g of the driving circuit 210g receives the signal Sig3, the level shifter 212g will convert the signal Sig3 that has the voltage operating range R2 as shown in FIG. 3B into the signal Sig4 that has the voltage operating range R1 as shown in FIG. 3A, so that the signal Sig4 will vary in the voltage operating range R1 of 0 V~3.8 V and thus can be utilized by the driving circuit 210g.

In conclusion, the driving circuits 210r, 210g, and 210b can be used in the framework such as the one shown in FIG. 2A or FIG. 2B in order to resolve the difference in forward voltage between different light emitting diodes and prevent signals from being misjudged when being transmitted between different driving circuits.

Figure 4A:
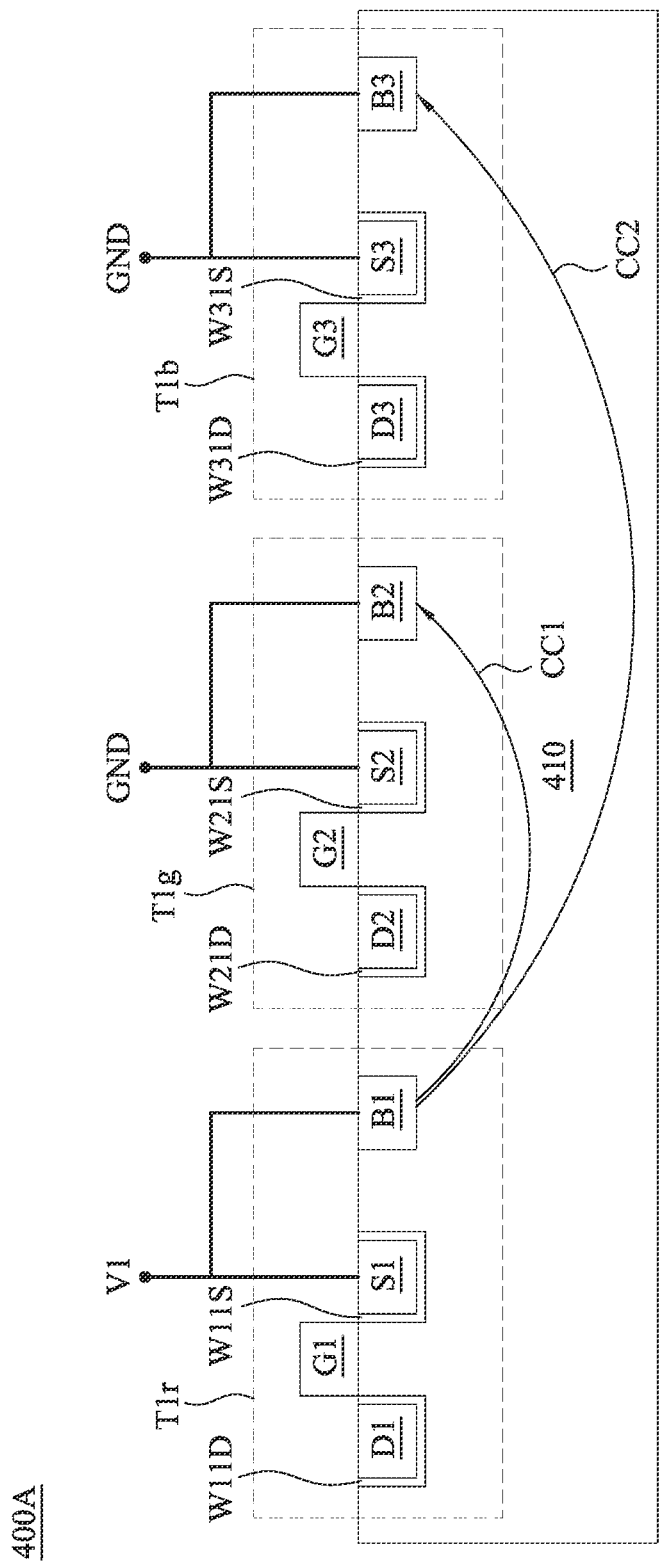
FIG. 4A is a cross section diagram of an integrated circuit device of the driving circuits in FIG. 2A in accordance with some embodiments of the present disclosure.

In one embodiment, the driving circuits 210r, 210g, and 210b are integrated into a single integrated circuit. In other words, the transistor T1r of the driving circuit 210r, the transistor T1g of the driving circuit 210g, and the transistor T1b of the driving circuit 210b are formed on the same substrate. Please refer to FIG. 4A. FIG. 4A is a cross section diagram of an integrated circuit device 400A of the driving circuits 210r, 210g, and 210b in FIG. 2A in accordance with some embodiments of the present disclosure. The integrated circuit 400A includes the transistors T1r, T1g, and T1b which are formed on the substrate 410 and respectively correspond to the transistors in the driving circuits 210r, 210g, and 210b stated above. In the embodiment shown in FIG. 4A, the number of the transistors is merely exemplary, and in different embodiment the integrated circuit device 400A can include multiple sets of the transistors T1r, T1g, and T1b. In one embodiment, the transistors T1r, T1g, and T1b are field-effect transistors (FETs). In one embodiment, the transistors T1r, T1g, and T1b are n-type metal oxide semiconductor (NMOS) FETs.

As shown in FIG. 4A, the transistor T1r has a first terminal D1, a gate G1, a second terminal S1, and a base B1.

It is worth noted that, assuming that the base B1 of the transistor T1r receives the ground voltage GND like the bases of other transistors do, if the second terminal S1 and the base B1 of the transistor T1r receive different voltage, the voltage that the second terminal S1 receives is then higher than the ground voltage GND that the base B1 receives. This will cause body effect in the transistor T1r, the current flowing from the first terminal D1 to the second terminal S1 when the transistor T1r conducts will be lowered.

In order to prevent the current passing through the transistor T1r from being lowered, the second terminal S1 and the base B1 of the transistor T1r both receive the first reference voltage V1 of about 1 V.

On the other hand, the transistor T1g also has a first terminal D2, a gate G2, a second terminal S2, and a base B2, and the transistor T1b has a structure similar to the transistors T1r and T1g. The base B2 of the transistor T1g and the base B3 of the transistor T1b both receive the ground voltage GND.

Although, in the embodiment shown in FIG. 4A, connecting the bases B1, B2, and B3 of the transistors T1r, T1g, and T1b respectively to the first reference voltage V1, the ground voltage GND, and the ground voltage GND can avoid the situation where the sources of the transistors T1, T1g, and T1b have voltages higher than their bases, it will in turn cause the bases of the transistors T1, T1g, and T1b having different voltages. Because the bases B1, B2, and B3 do not have any well structure, a problem of substrate short will occur. That is, a current CC1 will arise because of the voltage difference between the bases B1 and B2, and a current CC2 will arise because of the voltage difference between the bases B1 and B3.

Figure 4B:
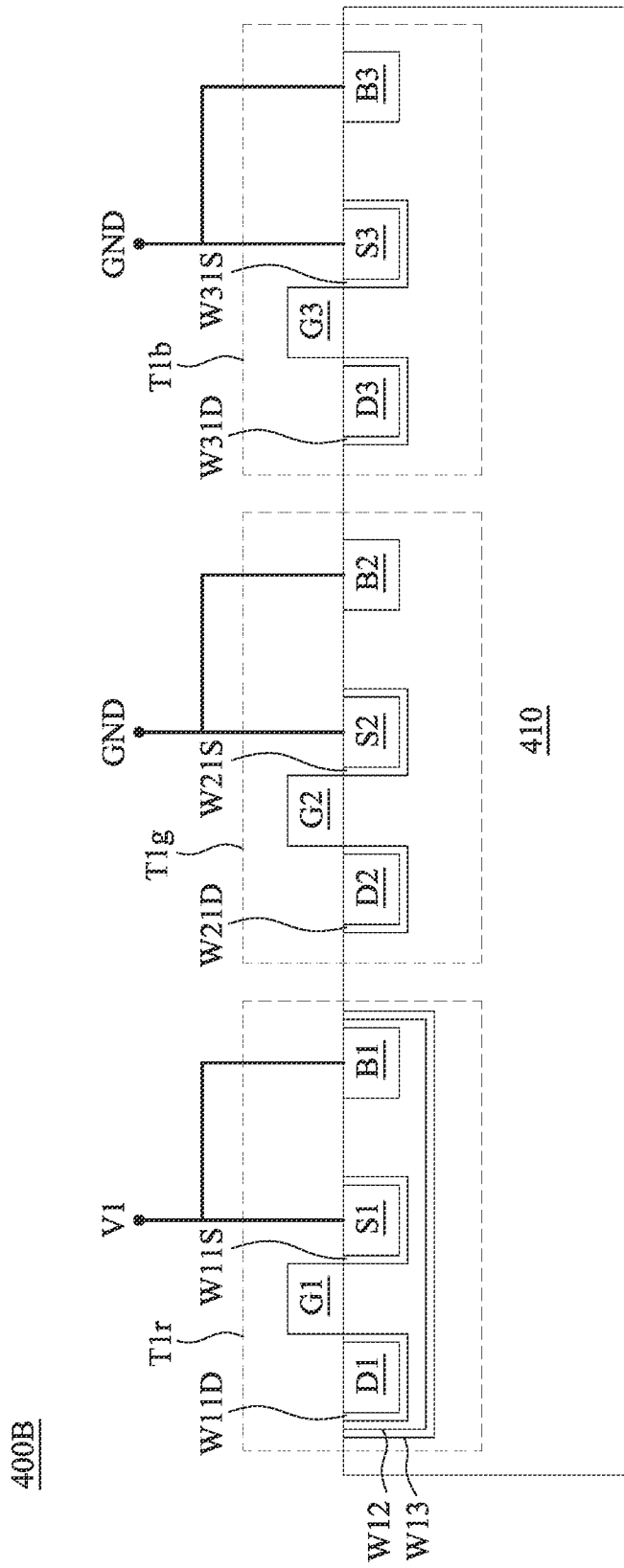
FIG. 4B is a cross section diagram of an integrated circuit device of the driving circuits in FIG. 2A in accordance with some embodiments of the present disclosure.

To avoid such problem, in one embodiment, the transistor T1r has a triple-well structure in order to isolate its base B1 from the base B2 of the transistor T1g and the base B3 of the transistor T1b. Please refer to FIG. 4B. FIG. 4B is a cross section diagram of an integrated circuit device 400B of the driving circuits 210r, 210g, and 210b in FIG. 2A in accordance with some embodiments of the present disclosure. In the integrated circuit device 400B, the transistor T1r had, other than a first well W11D and a first W11s, a second W12 and a third well W13. The second well W12 surrounds the first terminal D1, the second terminal S1, and the base B1, and the third W13 surrounds the second well W12, in order to electrically isolate the base B1 to avoid the substrate short problem mentioned above.

The present disclosure is not limited to the embodiment in which only the transistor T1r has the three-well structure. In an alternative embodiment, the transistors T1g and T1r can also have the three-well structure and thus obtain the same effect.

Figure 5A:
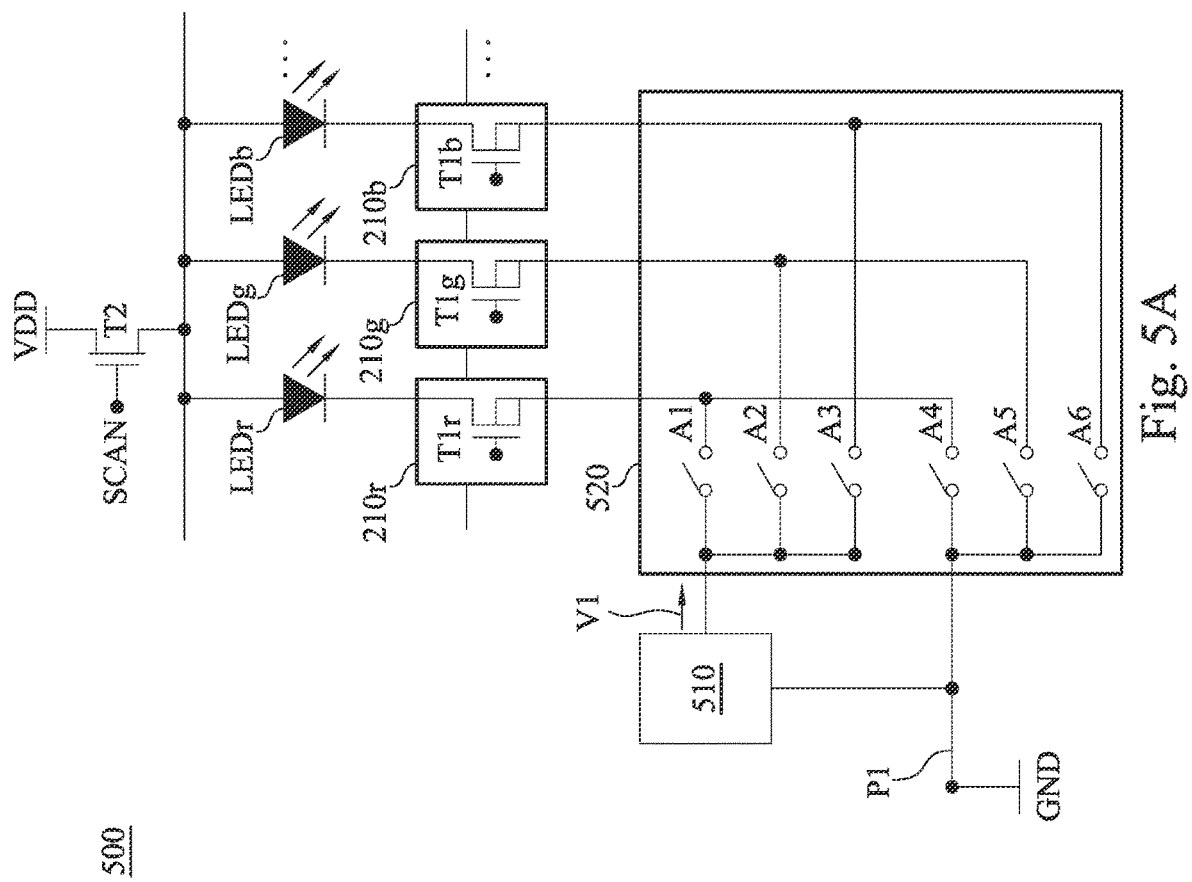
FIG. 5A is a diagram of a display panel in accordance with some embodiments of the present disclosure.

In another embodiment of the present disclosure, the transistors 210r, 210g, and 210b in FIG. 2A can be further electrically connected to a voltage-selection switch, so that the first reference voltage V1 or the ground voltage GND can be selected and received by the transistors. Please refer to FIG. 5A. FIG. 5A is a diagram of a display panel 500 in accordance with some embodiments of the present disclosure. The display panel 500 corresponds to a portion of the display panel 200 in FIG. 2A and has the transistors 210r, 210g, and 210b configured to drive the red light emitting diode LEDr, the green light emitting diode LEDg, and the blue light emitting diode LEDb.

In the embodiment shown in FIG. 5, the display panel 500 includes a level shifter 510 and a voltage-selection switch 520. The level shifter 510 is configured to receive the ground voltage GND and raise it to the first supply voltage V1. The voltage-selection switch 520 is electrically connected to the transistors T1r, T1g, and T1b, the level shifter 510, and a pin P1, which is configured to receive the ground voltage GND. In addition, the voltage-selection switch 520 is configured to control the second terminals of the transistors T1r, T1g, and T1b to receive the ground voltage GND or the first reference voltage V1. To be more specific, the voltage-selection switch 520 includes switches A1, A2, A3, A4, A5, and A6. Each of these switches has a conducting state and a disconnecting state in order to decide the voltage received by the second terminals of the transistors T1r, T1g, and T1b. It is worth noted that the display panel 500 can provide two voltages (i.e., the ground voltage GND and the first supply voltage V1) to the transistors T1r, T1g, and T1b by using a single pin P1 combined with the level shifter 510.

The below embodiments discuss how the voltage-selection switch 510 can help the display panel 500 switch between different common anode frameworks. Please refer to FIG. 5B. FIG. 5B is a diagram of the display panel 500 in accordance with some embodiments of the present disclosure. In the embodiment shown in FIG. 5B, the switches A1, A2, and A3 of the voltage-selection switch 520 are disconnected, and the switches A4, A5, and A6 of the voltage-selection switch 520 conduct, so the second terminals of the transistors T1r, T1g, and T1b receive the ground voltage GND. In other words, in the embodiment shown in FIG. 5B, the display panel 500 adopts a common anode framework as shown in FIG. 1A.

Figure 5C:
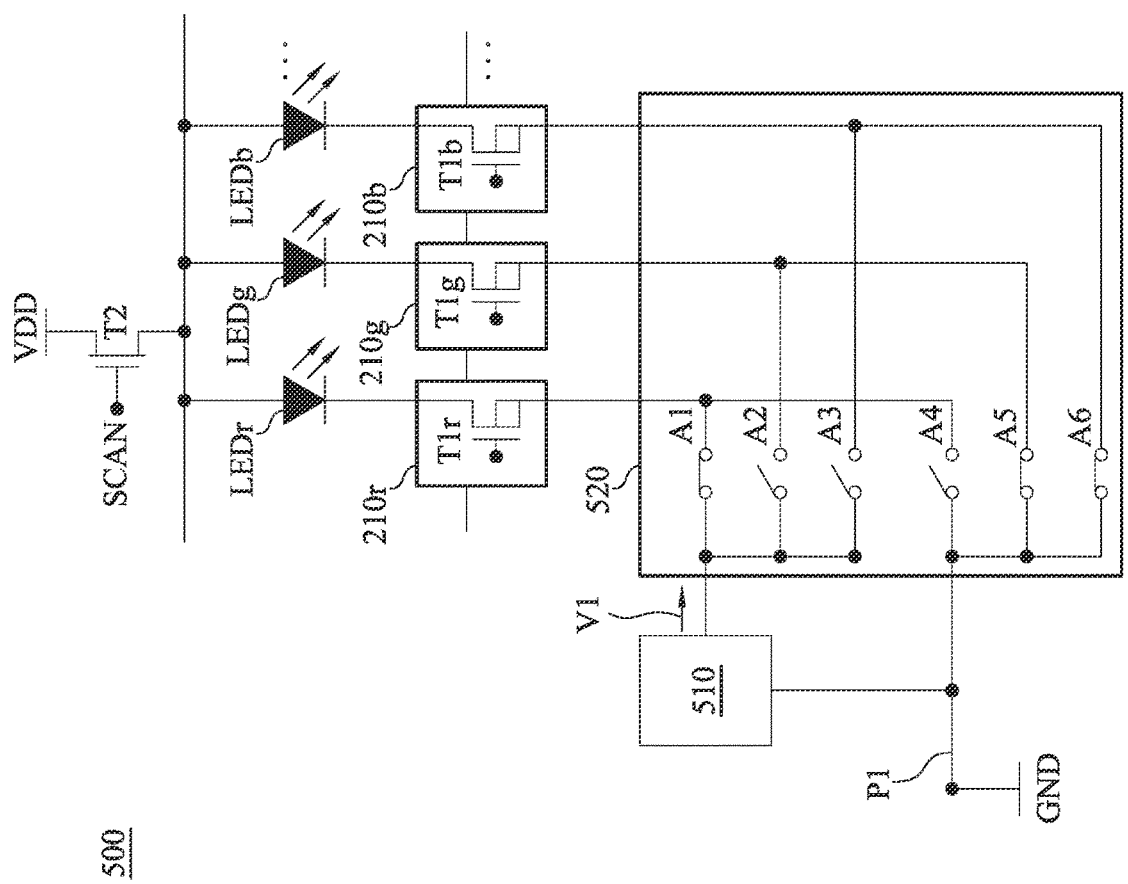
FIG. 5C is a diagram of a display panel in accordance with some embodiments of the present disclosure.

Please refer to FIG. 5C. FIG. 5C is a diagram of the display panel 500 in accordance with some embodiments of the present disclosure. In the embodiment shown in FIG. 5C, the switches A2, A3, and A4 of the voltage-selection switch 520 are disconnected, and the switches A1, A5, and A6 conduct, so the second terminals of the transistor T1r receives the first reference voltage V1, and the second terminals of the transistors T1g and T1b receive the ground voltage GND. In the embodiment shown in FIG. 5C, the display panel 500 adopts the common anode framework as shown in FIG. 1B.

In one embodiment, the transistors T1r, T1g, and T1b of the display panel 500 have structures similar to the one the transistors T1r, T1g, and T1b have in the embodiment shown in FIG. 4B. That is, the transistors T1r, T1g, and T1b in FIG. 5A, FIG. 5B, and FIG. 5C are formed on the same substrate, the second terminal and the base of each of them are connected together, and the transistor T1r has the three-well structure mentioned above. In this way, when the transistor T1r receives the first reference voltage V1 and the transistors T1g and T1b receive the ground voltage GND, there will be no problems such as body effect or substrate short described above.

In conclusion, the display panel 500 uses the level shifter 510 and the voltage-selection switch 520 to determine that the transistors T1r, T1g, and T1b receive the first reference voltage V1 or the ground voltage GND.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A driving circuit, comprising:
a transistor, wherein a first terminal of the transistor is electrically connected to a light emitting diode and configured to receive a supply voltage, and a second terminal of the transistor is configured to receive a first reference voltage; and
a level shifter, configured to receive an input signal from a previous-stage driving circuit and adjust a voltage level of the input signal according to a voltage operating range formed by the supply voltage and the first reference voltage, to generate a level-shifted signal that is consistent with the voltage operating range and is configured to control the transistor;
wherein the input signal varies between a second reference voltage and the supply voltage, and the second reference voltage and the first reference voltage are different from each other and both lower than the supply voltage.

2. The driving circuit of claim 1, wherein the level shifter is configured to transmit the level-shifted signal to a gate of the transistor.

3. The driving circuit of claim 1, further comprising:
a shift register, electrically connected to the level shifter, and configured to temporarily store the level-shifted signal and transmit the level-shifted signal to a next-stage driving circuit.

4. The driving circuit of claim 1, wherein the light emitting diode is a red light emitting diode, and the voltage operating range is smaller than a voltage difference between the supply voltage and a ground voltage.

5. The driving circuit of claim 1, wherein the light emitting diode is a green light emitting diode or a blue light emitting diode, and the voltage operating range is about equal to a voltage difference between the supply voltage and a ground voltage.

6. The driving circuit of claim 1, wherein a base and the second terminal of the transistor are configured to receive the first reference voltage.

7. A driving circuit, comprising:
a first transistor, wherein a first terminal of the first transistor is configured to receive a supply voltage, and a second terminal of the first transistor is electrically connected to a first light emitting diode, a second light emitting diode, and a third light emitting diode;
a second transistor, wherein a first terminal of the second transistor is electrically connected to the first light emitting diode, and a second terminal of the second transistor is configured to receive a first reference voltage;
a third transistor, wherein a first terminal of the third transistor is electrically connected to the second light emitting diode, and a second terminal of the third transistor is configured to receive a second reference voltage;
a fourth transistor, wherein a first terminal of the fourth transistor is electrically connected to the third light emitting diode, and a second terminal of the fourth transistor is configured to receive the first reference voltage;
a first level shifter, configured to receive a first signal and generate a second signal according to the first signal;
a second level shifter, configured to receive the second signal and generate a third signal according to the second signal; and
a third level shifter, configured to receive the third signal and generate a fourth signal according to the third signal;
wherein, the first level shifter is configured to transmit the second signal to the second level shifter and a gate of the second transistor, the second level shifter is configured to transmit the third signal to the third level shifter and a gate of the third transistor, and the third level shifter is configured to transmit the fourth signal to a gate of the fourth transistor.

8. The driving circuit of claim 7, wherein:
the first level shifter is configured to adjust a voltage level of the first signal according to a first voltage operating range formed by the supply voltage and the first reference voltage, to generate the second signal that is consistent with the first voltage operating range.

9. The driving circuit of claim 7, wherein:
the second level shifter is configured to adjust a voltage level of the second signal according to a second voltage operating range formed by the supply voltage and the second reference voltage, to generate the third signal that is consistent with the second voltage operating range.

10. The driving circuit of claim 7, further comprising:
a first shift register, configured to receive the second signal from the first level shifter and temporarily store the second signal;
a second shift register, configured to receive the third signal from the second level shifter and temporarily store the third signal; and
a third shift register, configured to receive the fourth signal from the third level shifter and temporarily store the fourth signal.

11. The driving circuit of claim 10, wherein:
the first shift register is configured to transmit the second signal to the second level shifter; and
the second shift register is configured to transmit the third signal to the third level shifter.

12. The driving circuit of claim 7, wherein:
the second transistor, the third transistor, and the fourth transistor are formed on a substrate all together.

13. The driving circuit of claim 7, wherein:
a base of the second transistor is configured to receive the first reference voltage, a base of the third transistor is configured to receive the second reference voltage, and a base of the fourth transistor is configured to receive the first reference voltage.

14. The driving circuit of claim 7, wherein:
a base and the second terminal of the second transistor are electrically connected to each other, a base and the second terminal of the third transistor are electrically connected to each other, and a base and the second terminal of the fourth transistor are electrically connected to each other.

15. The driving circuit of claim 7, wherein the third transistor has a three-well structure.

16. A driving circuit, comprising:
a first transistor, wherein a first terminal of the first transistor is configured to receive a supply voltage, and a second terminal of the first transistor is electrically connected to a first light emitting diode, a second light emitting diode, and a third light emitting diode;
a second transistor, wherein a first terminal of the second transistor is electrically connected to the first light emitting diode;
a third transistor, wherein a first terminal of the third transistor is electrically connected to the second light emitting diode;
a fourth transistor, wherein a first terminal of the fourth transistor is electrically connected to the third light emitting diode;
a level shifter, configured to receive a ground voltage and raise the ground voltage to a third reference voltage; and
a voltage-selection switch, electrically connected to the second transistor, the third transistor, and the fourth transistor and configured to control second terminals of the second transistor, the third transistor, and the fourth transistor to receive the ground voltage or the third reference voltage.

17. The driving circuit of claim 16, wherein the second terminal of the second transistor is configured to receive the third reference voltage, and the second terminals of the third transistor and the fourth transistor are configured to receive the ground voltage.

18. The driving circuit of claim 17, wherein a base of the second transistor is configured to receive the third reference voltage, and bases of the third transistor and the fourth transistor are configured to receive the ground voltage.

19. The driving circuit of claim 16, wherein the second transistor has a three-well structure and is formed on a substrate together with the third transistor and the fourth transistor.

20. The driving circuit of claim 19, wherein one of the third transistor and the fourth transistor has the three-well structure, the second terminal and a base of the one of the third transistor and the fourth transistor are configured to receive a fourth reference voltage, the fourth reference voltage is different from the third reference voltage and the ground voltage, and the second terminal and a base of the other of the third transistor and the fourth transistor are configured to receive the ground voltage.

\* \* \* \* \*